(12) United States Patent
Cha et al.

(10) Patent No.: US 11,423,839 B2
(45) Date of Patent: Aug. 23, 2022

(54) DISPLAY DEVICE

(71) Applicant: Samsung Display Co., Ltd., Yongin-si (KR)

(72) Inventors: Myounggeun Cha, Seoul (KR); Sanggun Choi, Suwon-si (KR); Jiyeong Shin, Busan (KR); Yongsu Lee, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/264,703

(22) PCT Filed: Mar. 29, 2019

(86) PCT No.: PCT/KR2019/003695
§ 371 (c)(1),
(2) Date: Jan. 29, 2021

(87) PCT Pub. No.: WO2020/032342
PCT Pub. Date: Feb. 13, 2020

(65) Prior Publication Data
US 2021/0312865 A1 Oct. 7, 2021

(30) Foreign Application Priority Data

Aug. 7, 2018 (KR) ........................ 10-2018-0092107

(51) Int. Cl.
*G09G 3/3258* (2016.01)
*G09G 3/3233* (2016.01)
*G09G 3/3225* (2016.01)

(52) U.S. Cl.
CPC ......... *G09G 3/3258* (2013.01); *G09G 3/3233* (2013.01); *G09G 3/3225* (2013.01);
(Continued)

(58) Field of Classification Search
CPC .. G09G 3/3225; G09G 3/3258; G09G 3/3233; G09G 2300/043;
(Continued)

(56) References Cited

U.S. PATENT DOCUMENTS 9,530,800 B2  12/2016  Wang et al.
10,140,039 B1  11/2018  Baruch et al.
(Continued)

FOREIGN PATENT DOCUMENTS

JP           4942341 B2    5/2012
KR    10-2014-0085305 A   7/2014
(Continued)

OTHER PUBLICATIONS

International Search Report for corresponding Application No. PCT/KR2019/003695 dated Jul. 8, 2019, 4pp.

*Primary Examiner* — Tom V Sheng
(74) *Attorney, Agent, or Firm* — Lewis Roca Rothgerber Christie LLP

(57) ABSTRACT

A display device may include a substrate, an organic light emitting element on the substrate, a pixel circuit between the substrate and the organic light emitting element, electrically connected to the organic light emitting element, and including a first transistor and a second transistor, a first metal layer between the substrate and the pixel circuit, overlapping the first transistor, and configured to receive a first voltage, and a second metal layer between the substrate and the pixel circuit, overlapping the second transistor, and configured to receive a second voltage different from the first voltage.

18 Claims, 10 Drawing Sheets

(52) U.S. Cl.
CPC .............. *G09G 2300/043* (2013.01); *G09G 2300/0426* (2013.01); *G09G 2300/0439* (2013.01); *G09G 2300/0823* (2013.01); *G09G 2310/0254* (2013.01)

(58) Field of Classification Search
CPC ... G09G 2300/0426; G09G 2300/0439; G09G 2300/0823; G09G 2310/0254; H01L 27/32
USPC .......................................................... 345/209
See application file for complete search history.

(56) References Cited

U.S. PATENT DOCUMENTS

| | | | |
|---|---|---|---|
| 2011/0031492 | A1* | 2/2011 | Yamazaki ........... H01L 27/1255 257/43 |
| 2012/0280234 | A1* | 11/2012 | Koezuka ........... H01L 29/66969 257/57 |
| 2014/0183476 | A1* | 7/2014 | Kwon ............... H01L 29/41733 257/40 |
| 2017/0206826 | A1 | 7/2017 | Kong et al. |
| 2019/0115412 | A1* | 4/2019 | Cha ...................... H01L 27/3265 |
| 2019/0197965 | A1* | 6/2019 | Park ....................... H01L 27/124 |
| 2020/0118508 | A1* | 4/2020 | Park ..................... H01L 27/1255 |
| 2020/0211477 | A1* | 7/2020 | Lai ........................ G09G 3/3266 |
| 2020/0219453 | A1* | 7/2020 | Park ..................... H01L 51/5221 |
| 2020/0219962 | A1* | 7/2020 | Park ..................... G09G 3/3233 |

FOREIGN PATENT DOCUMENTS

| | | |
|---|---|---|
| KR | 10-2016-0005814 A | 1/2016 |
| KR | 10-2016-0017719 A | 2/2016 |
| KR | 10-2017-0064128 A | 6/2017 |
| KR | 10-2017-0081036 A | 7/2017 |
| KR | 10-2017-0087079 A | 7/2017 |
| KR | 10-2018-0079106 A | 7/2018 |

\* cited by examiner

DISPLAY DEVICE

CROSS-REFERENCE TO RELATED APPLICATIONS

This application is a National Phase patent application and claims priority to and the benefit of International Application Number PCT/KR2019/003695, filed on Mar. 29, 2019, which claims priority to Korean Patent Application Number 10-2018-0092107, filed on Aug. 7, 2018, the entire contents of each of which are incorporated herein by reference.

TECHNICAL FIELD

Embodiments related to a display device. More particularly, embodiments relate to an organic light emitting display device including a plurality of transistors.

BACKGROUND ART

Recently, flat display devices are generally used as a display device. In particular, an organic light emitting display device among the flat display devices has been spotlighted as a next-generation display device because of advantages of being relatively thin and light and having low power consumption and high response speed.

The organic light emitting display device may include a plurality of thin film transistors and organic light emitting elements connected to the thin film transistors. The organic light emitting element may emit light having a luminance corresponding to a voltage supplied to the organic light emitting element through a thin film transistor.

DISCLOSURE

Technical Problem

Some example embodiments include a display device including a transistor having improved characteristics.

Technical Solution

In order to achieve the object of the present invention described above, a display device may include a substrate, an organic light emitting element on the substrate, a pixel circuit between the substrate and the organic light emitting element, electrically connected to the organic light emitting element, and including a first transistor and a second transistor, a first metal layer between the substrate and the pixel circuit, overlapping the first transistor, and supplied with a first voltage, and a second metal layer between the substrate and the pixel circuit, overlapping the second transistor, and supplied with a second voltage different from the first voltage.

In one embodiment, the first voltage and the second voltage may have polarities different from each other.

In one embodiment, the first transistor and the second transistor may have driving ranges different from each other.

In one embodiment, the first voltage may have a negative polarity, and the second voltage may have a positive polarity.

In one embodiment, the first voltage may be −3 V to −5 V.

In one embodiment, the second voltage may be +4 V to +6 V.

In one embodiment, the first transistor may include a first active pattern on the substrate and including a first channel, and a first gate electrode on the first active pattern, and the first metal layer may overlap the first channel.

In one embodiment, the second transistor may include a second active pattern connected between the first active pattern and the first gate electrode and including a second channel, and a second gate electrode on the second active pattern, and the second metal layer may overlap the second channel.

In one embodiment, the pixel circuit may further include a third transistor including a third active pattern connected to the first active pattern, and a third gate electrode on the third active pattern, and the second metal layer may overlap the third channel.

In one embodiment, the first transistor may have a driving range wider than a driving range of the second transistor.

In one embodiment, the first metal layer may be connected to a connection line outside the pixel circuit.

In one embodiment, the second metal layer may be connected to a connection line outside the pixel circuit or connected to a driving voltage line crossing the pixel circuit.

In one embodiment, each of the first transistor and the second transistor may include a PMOS transistor.

In order to achieve the object of the present invention described above, a display device may include a substrate including a display area and a peripheral area, a plurality of organic light emitting elements on the display area of the substrate, a plurality of pixel circuits between the substrate and the organic light emitting elements, electrically connected to the organic light emitting elements, respectively, and each including a first transistor and a second transistor, a plurality of first metal lines between the substrate and the pixel circuits, overlapping the first transistor of each of the pixel circuits, and supplied with a first voltage, and a plurality of second metal lines between the substrate and the pixel circuits, overlapping the second transistor of each of the pixel circuits, and supplied with a second voltage different from the first voltage.

In one embodiment, the display device may further include a plurality of driving voltage lines extending in a first direction and supplying driving voltages to the organic light emitting elements. The first metal lines and the second metal lines may extend in a second direction intersecting the first direction.

In one embodiment, the display device may further include a first connection line extending in the first direction and connected to the first metal lines. The first connection line may receive the first voltage through a first pad on the peripheral area of the substrate.

In one embodiment, the second metal lines may be connected to the driving voltage lines, respectively, and the second metal lines may receive the second voltage through the driving voltage lines, respectively.

In one embodiment, the display device may further include a second connection line extending in the first direction and connected to the second metal lines. The second connection line may receive the second voltage through a second pad on the peripheral area of the substrate.

In one embodiment, the first voltage and the second voltage may have polarities different from each other.

In one embodiment, the first transistor and the second transistor may have driving ranges different from each other.

Advantageous Effects

In the display device according to the embodiments, the first voltage supplied to the first metal layer overlapping the first transistor and the second voltage supplied to the second metal layer overlapping the second transistor may be different from each other, so that the driving range of the first transistor and the driving range of the second transistor may be different from each other, and characteristics of the first and second transistor may be improved.

BEST MODE

Mode for Invention

Hereinafter, display devices in accordance with embodiments of the present invention will be explained in detail with reference to the accompanying drawings.

Hereinafter, a display device according to one embodiment of the present invention will be described with reference to FIGS. 1 to 4.

Figure 1:
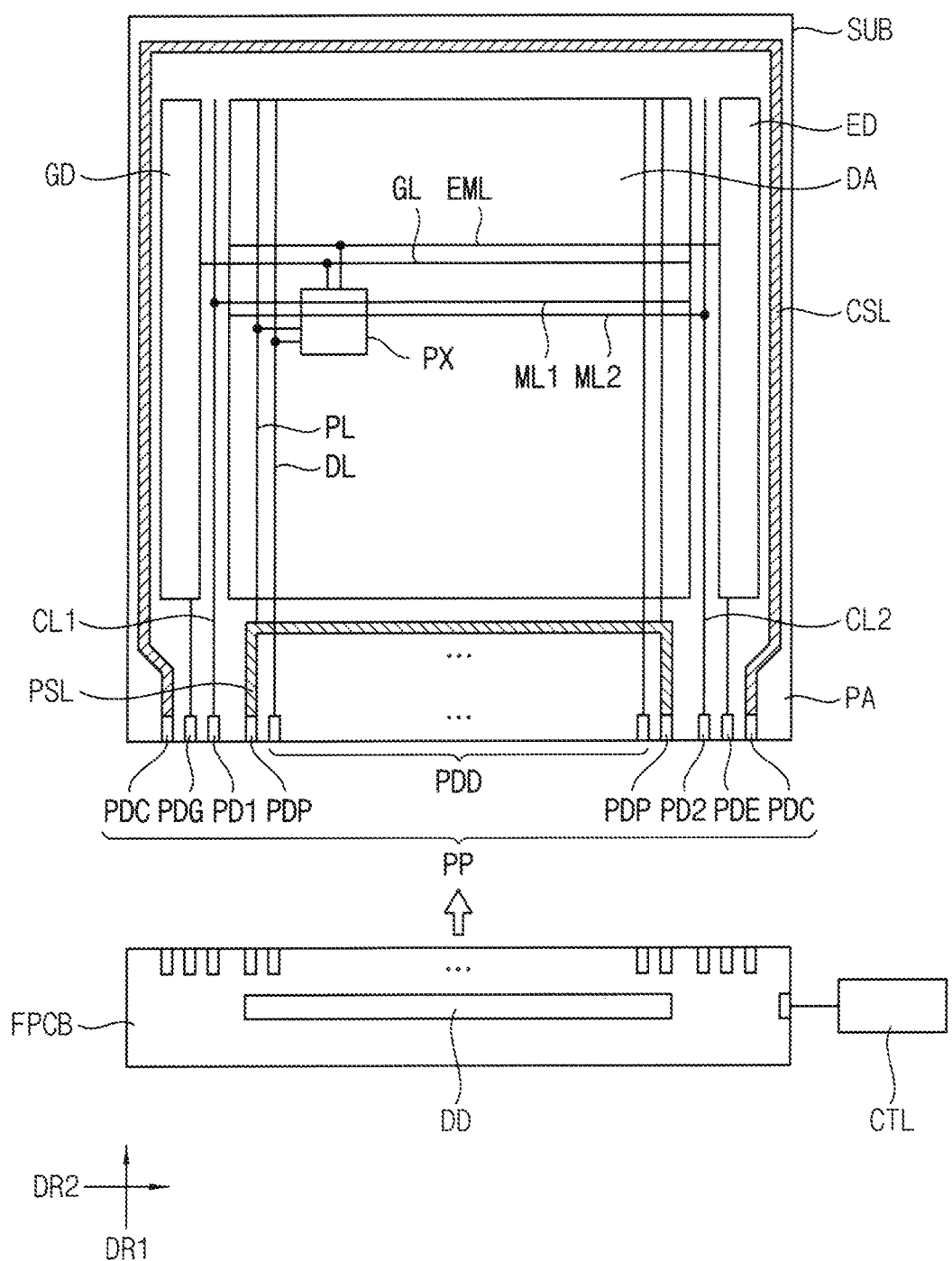
FIG. 1 is a plan view schematically showing the display device according to one embodiment of the present invention.

FIG. 1 is a plan view schematically showing the display device according to one embodiment of the present invention. Hereinafter, a pixel may denote a minimum unit for displaying an image.

Referring to FIG. 1, the display device according to one embodiment of the present invention may include a substrate SUB, a plurality of pixels PX, a plurality of data lines DL, a plurality of gate lines GL, a plurality of light emitting control lines EML, a plurality of driving voltage lines PL, a data driver DD, a gate driver GD, a light emitting control driver ED, a driving voltage supply line PSL, a common voltage supply line CSL, a plurality of first metal lines ML1, a plurality of second metal lines ML2, a first connection line CL1, and a second connection line CL2.

The substrate SUB may include a display area DA for displaying an image, and a peripheral area PA neighboring to the display area DA. The pixels PX, the data lines DL, the gate lines GL, the light emitting control lines EML, and the driving voltage lines PL may be located in the display area DA.

The pixels PX may be positioned in the display area DA on the substrate SUB. Each of the pixels PX may be connected to the data lines DL, the driving voltage lines PL, the gate lines GL, and the light emitting control lines EML. Each of the pixels PX may include an organic light emitting element emitting light at a luminance corresponding to a driving current corresponding to a signal supplied from the data lines DL switched by the gate lines GL, and a pixel circuit including a plurality of thin film transistors for controlling a driving current flowing in the organic light emitting element, and at least one capacitor. Accordingly, a plurality of organic light emitting elements and a plurality of pixel circuits including a plurality of thin film transistors connected to the organic light emitting elements, respectively, may be positioned in the display area DA on the substrate SUB. The pixel circuit may be positioned between the substrate SUB and the organic light emitting element in the pixel PX.

The data lines DL may be electrically connected to the data driver DD and extend in a first direction D1. The data lines DL may be connected to the pixels PX.

The gate lines GL may be connected to the gate driver GD and extend in a second direction DR2 intersecting the first direction DR1. The gate lines GL may be connected to the pixels PX, and may include a first scan line, a second scan line, a third scan line, and an initialization voltage line. The first scan line, the second scan line, the third scan line, and the initialization voltage line will be described later.

The light emitting control lines EML may be connected to the light emitting control driver ED and extend in the second direction DR2 parallel to the gate lines GL. The light emitting control lines EML may be connected to the pixels PX.

The driving voltage lines PL may be connected to the driving voltage supply line PSL and extend in the first direction DR1 parallel to the data lines DL. The driving voltage lines PL may be connected to the pixels PX.

The peripheral area PA may be positioned at an outer portion of the display area DA. For example, the peripheral area PA may surround a periphery of the display area DA. The peripheral area PA, as an area in which the pixels PX are not located, may not provide an image. A gate driver GD, a light emitting control driver ED, a pad portion PP, a driving voltage supply line PSL, and a common voltage supply line CSL may be located in the peripheral area PA.

The gate driver GD may be located in the peripheral area PA on the substrate SUB, and may generate a gate signal and transmit the gate signal to each pixel PX through the gate lines GL. In one embodiment, the gate driver GD may be located on a left or right side of the display area DA, but the present invention is not limited thereto. In another embodiment, two gate drivers may be located on the left and right sides, respectively.

The light emitting control driver ED may be located in the peripheral area PA on the substrate SUB, and may generate a light emitting control signal and transmit the light emitting control signal to each pixel PX through the light emitting control lines EML. In one embodiment, the light emitting control driver ED may be located on a left or right side of the display area DA, but the present invention is not limited thereto. In another embodiment, two light emitting control drivers may be located on the left and right sides, respectively.

The pad portion PP may be located at one end of the substrate SUB, and include a plurality of pads PDD, PDP, PD1, PD2, PDG, PDE, and PDC. The pad portion PP may be exposed without being covered by an insulating layer so as to be electrically connected to a flexible printed circuit board FPCB.

The flexible printed circuit board FPCB may electrically connect a controller CTL to the pad portion PP. A signal or voltage transmitted from the controller CTL may move through the lines DL, PSL, CL1, CL2, and CSL connected to the pad portion PP.

The controller CTL may receive a vertical synchronization signal, a horizontal synchronization signal, and a clock signal to generate a control signal for controlling driving of the gate driver GD and the light emitting control driver ED, and the generated signal may be transmitted to the gate driver GD and the light emitting control driver ED through wires and the pads PDG and PDE connected to the flexible printed circuit board FPCB. The gate signal of the gate driver GD may be provided to each pixel PX through the gate line GL, and the light emitting control signal of the light emitting control driver ED may be provided to each pixel PX through the light emitting control line EML. In addition, the controller CTL may provide a driving voltage ELVDD and a common voltage ELVSS to the driving voltage supply line PSL and the common voltage supply line CSL, respectively, through the pads PDP and PDC connected to the flexible printed circuit board FPCB. The driving voltage ELVDD may be provided to each pixel PX through the driving voltage line PL, and the common voltage ELVSS may be provided to a counter electrode of the pixel PX.

The data driver DD may be located on the flexible printed circuit board FPCB. The data driver DD may provide the data signal to each pixel PX. The data signal of the data driver DD may be provided to each pixel PX through the pad PDD, a wire connected to the pad PDD, and the data line DL connected to the wire. Although FIG. 1 shows a structure in which the data driver DD is located on the flexible printed circuit board FPCB, the present invention is not limited thereto. In another embodiment, the data driver DD may be located in the peripheral area PA on the substrate SUB.

The driving voltage supply line PSL may be located in the peripheral area PA on the substrate SUB. For example, the driving voltage supply line PSL may be located between the pad portion PP and the display area DA. The driving voltage ELVDD provided through the driving voltage supply line PSL connected to the pad PDP may be provided to each pixel PX through the driving voltage line PL.

The common voltage supply line CSL may be located in the peripheral area PA on the substrate SUB, and provide the common voltage ELVSS to the counter electrode (e.g., a cathode) of the organic light emitting element of the pixel PX. For example, the common voltage supply line CSL may have one side in an open loop shape, and extend along an edge of the substrate SUB except the pad portion PP.

The first metal lines ML1 and the second metal lines ML2 may extend in the second direction DR2 parallel to the gate lines GL. Each of the first metal lines ML1 and each of the second metal lines ML2 may pass through each of the pixels PX. For example, each first metal line ML1 and each second metal line ML2 may pass through the pixels PX positioned in each pixel row.

The first connection line CL1 and the second connection line CL2 may be located in the peripheral area PA on the substrate SUB. The first connection line CL1 and the second connection line CL2 may extend in the first direction DR1 parallel to the data lines DL.

The first connection line CL1 may be connected between the first metal lines ML1 and the first pad PD1 positioned in the pad portion PP. The first connection line CL1 may be connected to the flexible printed circuit board FPCB through the first pad PD1, and a first voltage generated from the controller CTL may be transmitted to the first metal lines ML1 through the first pad PD1 connected to the flexible printed circuit board FPCB, and through the first connection line CL1.

The second connection line CL2 may be connected between the second metal lines ML2 and the second pad PD2 positioned in the pad portion PP. The second connection line CL2 may be connected to the flexible printed circuit board FPCB through the second pad PD2, and a second voltage generated from the controller CTL and different from the first voltage may be transmitted to the second metal lines ML2 through the second pad PD2 connected to the flexible printed circuit board FPCB, and through the second connection line CL2.

Hereinafter, a circuit of one pixel PX of the display device according to one embodiment of the present invention will be described with reference to FIG. 2.

Figure 2:
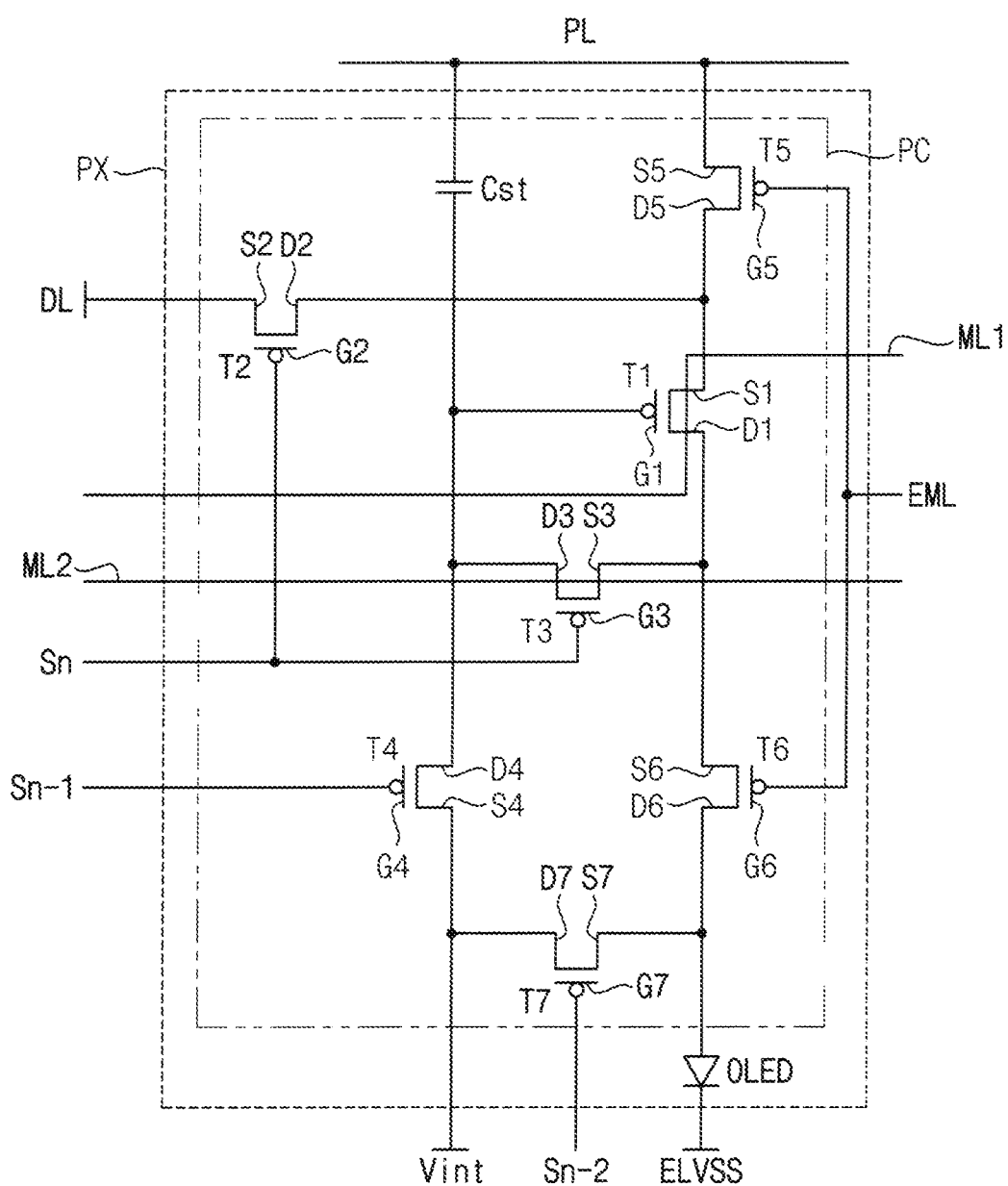
FIG. 2 is a circuit diagram showing one pixel of a display device according to one embodiment of the present invention.

FIG. 2 is a circuit diagram showing one pixel of the display device according to one embodiment of the present invention. For example, FIG. 2 may show an example of one pixel of the display device of FIG. 1.

Referring to FIG. 2, one pixel PX of the display device according to one embodiment of the present invention may include a pixel circuit PC and an organic light emitting element OLED connected to the pixel circuit PC. The pixel circuit PC may include a plurality of thin film transistors T1, T2, T3, T4, T5, T6, and T7, and a capacitor Cst. The thin film transistors T1, T2, T3, T4, T5, T6, and T7 may be selectively connected to each of a first scan line Sn, a second scan line Sn-1, a third scan line Sn-2, a light emitting control line EML, an initialization voltage line Vint, a data line DL, and a driving voltage line PL.

The above-described first metal line ML1 may pass through at least one of the thin film transistors T1, T2, T3, T4, T5, T6, and T7 included in the pixel circuit PC, and the above-described second metal line ML2 may pass through at least one of the other thin film transistors. The first metal line ML1 may overlap an active pattern of the at least one thin film transistor, and the second metal line ML2 may overlap an active pattern of the at least one of the other thin film transistors.

The first scan line Sn, the second scan line Sn-1, the third scan line Sn-2, and the initialization voltage line Vint may be included in the above-described gate line GL. The first scan line Sn, the second scan line Sn-1, the third scan line Sn-2, the light emitting control line EML, the initialization voltage line Vint, the data line DL, and the driving voltage line PL may include same or different materials, and may be positioned on the same or different layers on the substrate SUB.

The thin film transistors T1, T2, T3, T4, T5, T6, and T7 may include a first thin film transistor T1, a second thin film transistor T2, a third thin film transistor T3, a fourth thin film transistor T4, a fifth thin film transistor T5, a sixth thin film transistor T6, and a seventh thin film transistor T7.

A first gate electrode G1 of the first thin film transistor T1 may be connected to a third drain electrode D3 of the third thin film transistor T3, a fourth drain electrode D4 of the fourth thin film transistor T4, and one electrode of the capacitor Cst. A first source electrode S1 of the first thin film transistor T1 may be connected to a second drain electrode D2 of the second thin film transistor T2 and a fifth drain electrode D5 of the fifth thin film transistor T5, and a first drain electrode D1 may be connected to a third source electrode S3 of the third thin film transistor T3 and a sixth source electrode S6 of the sixth thin film transistor T6. The first thin film transistor T1 may be a driving thin film transistor that controls an amount of a current passing through the organic light emitting element OLED. The first metal line ML1 may pass through the first thin film transistor T1, and specifically, the first metal line ML1 may overlap the active pattern of the first thin film transistor T1 while crossing the pixel circuit PC.

A second gate electrode G2 of the second thin film transistor T2 may be connected to the first scan line Sn. A second source electrode S2 of the second thin film transistor T2 may be connected to the data line DL, and the second drain electrode D2 may be connected to the first source electrode S1 of the first thin film transistor T1. The second thin film transistor T2 may be a switching thin film transistor that turns on or turns off the first thin film transistor T1 serving as a driving thin film transistor.

A third gate electrode G3 of the third thin film transistor T3 may be connected to the first scan line Sn. The third source electrode S3 of the third thin film transistor T3 may be connected to the first drain electrode D1 of the first thin film transistor T1, and the third drain electrode D3 may be connected to the first gate electrode G1 of the first thin film transistor T1. The third thin film transistor T3 may be a compensation thin film transistor connected between the first drain electrode D1 and the first gate electrode G1 of the first thin film transistor T1 serving as a driving thin film transistor. The second metal line ML2 may pass through the third thin film transistor T3, and specifically, the second metal line ML2 may overlap the active pattern of the third thin film transistor T3 while crossing the pixel circuit PC.

A fourth gate electrode G4 of the fourth thin film transistor T4 may be connected to the second scan line Sn-1. A fourth source electrode S4 of the fourth thin film transistor T4 may be connected to the initialization voltage line Vint, and the fourth drain electrode D4 may be connected to the first gate electrode G1 of the first thin film transistor T1. The fourth thin film transistor T4 may be an initialization thin film transistor that initializes the first gate electrode G1 of the first thin film transistor T1 serving as a driving thin film transistor.

The fifth gate electrode G5 of the fifth thin film transistor T5 may be connected to the light emitting control line EML. A fifth source electrode S5 of the fifth thin film transistor T5 may be connected to the driving voltage line PL, and the fifth drain electrode D5 may be connected to the first source electrode S1 of the first thin film transistor T1.

A sixth gate electrode G6 of the sixth thin film transistor T6 may be connected to the light emitting control line EML. The sixth source electrode S6 of the sixth thin film transistor T6 may be connected to the first drain electrode D1 of the first thin film transistor T1, and the sixth drain electrode D6 may be connected to the organic light emitting element OLED. The first thin film transistor T1 may be electrically connected to the organic light emitting element OLED through the sixth thin film transistor T6. The fifth thin film transistor T5 and the sixth thin film transistor T6 may be light emitting control thin film transistors that electrically connect the first thin film transistor T1 as a driving thin film transistor to the driving voltage line PL and the organic light emitting element OLED, respectively.

A seventh gate electrode G7 of the seventh thin film transistor T7 may be connected to the third scan line Sn-2. A seventh source electrode S7 of the seventh thin film transistor T7 may be connected to the organic light emitting element OLED, and a seventh drain electrode D7 may be connected to the fourth source electrode S4 of the fourth thin film transistor T4.

All of the thin film transistors T1, T2, T3, T4, T5, T6, and T7 may be the same type of transistor. In one embodiment, all of the thin film transistors T1, T2, T3, T4, T5, T6, and T7 may be a PMOS transistor. However, the present invention is not limited thereto. In another embodiment, all of the thin film transistors T1, T2, T3, T4, T5, T6, and T7 may be an NMOS transistor.

The capacitor Cst may include one electrode connected to the first gate electrode G1 of the first thin film transistor T1 and the third drain electrode D3 of the third thin film transistor T3 and the other electrode connected to the driving voltage line PL.

The organic light emitting element OLED may include a first electrode, a second electrode positioned on the first electrode, and an organic light emitting layer positioned between the first electrode and the second electrode. The first electrode of the organic light emitting element OLED may be connected to the seventh source electrode S7 of the seventh thin film transistor T7 and the sixth drain electrode D6 of the sixth thin film transistor T6, and the second electrode may be connected to the common voltage supply line CSL to which the common voltage ELVSS is supplied.

Hereinafter, the arrangement of one pixel of the display device according to one embodiment of the present invention will be described with reference to FIGS. 3 and 4.

Insulating layers may be positioned between the components positioned in different layers described below, and each of the insulating layers may be an inorganic insulating layer or organic insulating layer including silicon nitride, silicon oxide, or the like. In addition, the insulating layers may be formed as a single layer or a multilayer.

Figure 3:
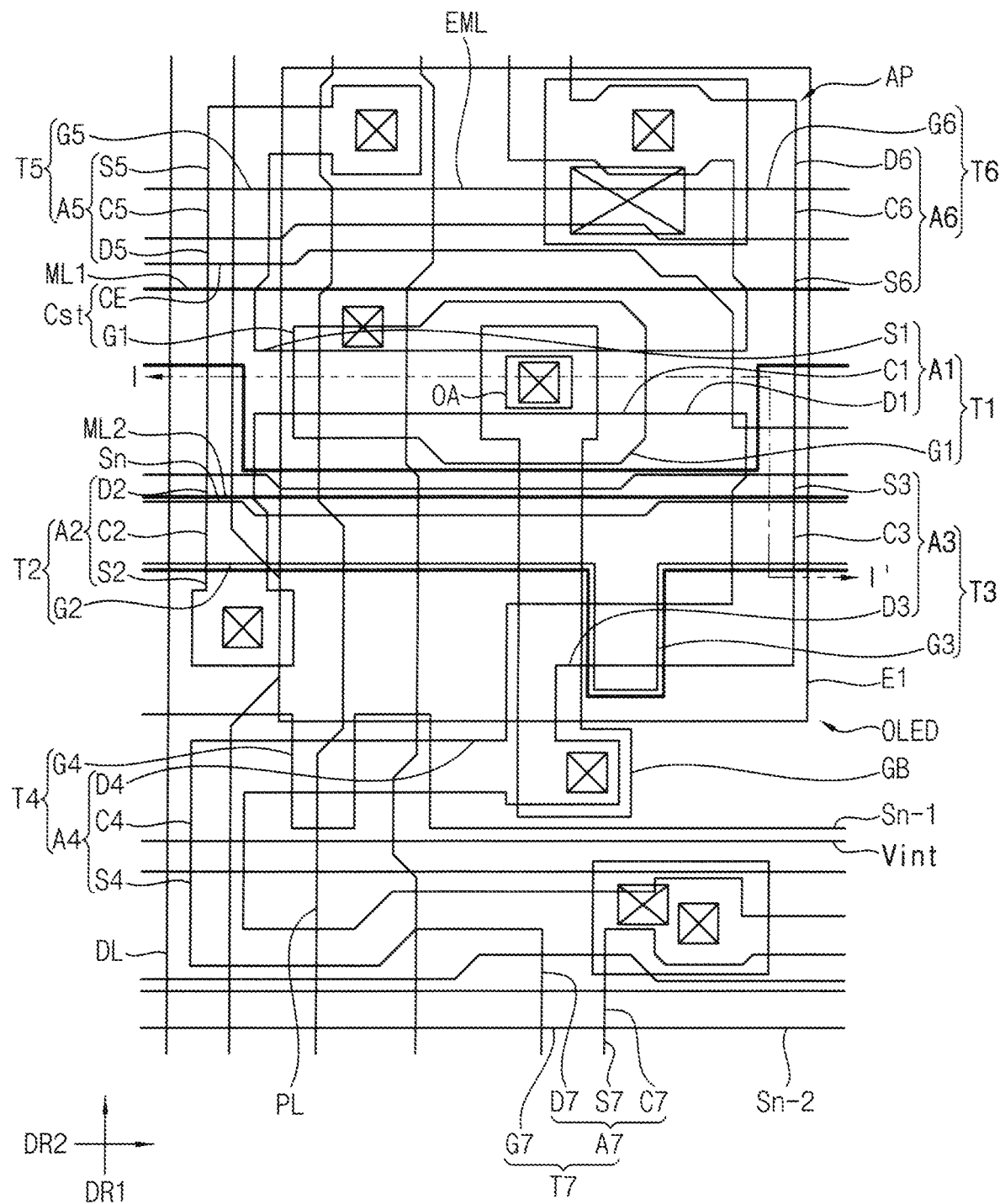
FIG. 3 is a layout view showing the one pixel of FIG. 2.

FIG. 3 is a layout view showing the one pixel of FIG. 2. FIG. 4 is a sectional view taken along line I-I' of the display device of FIG. 3.

Figure 4:
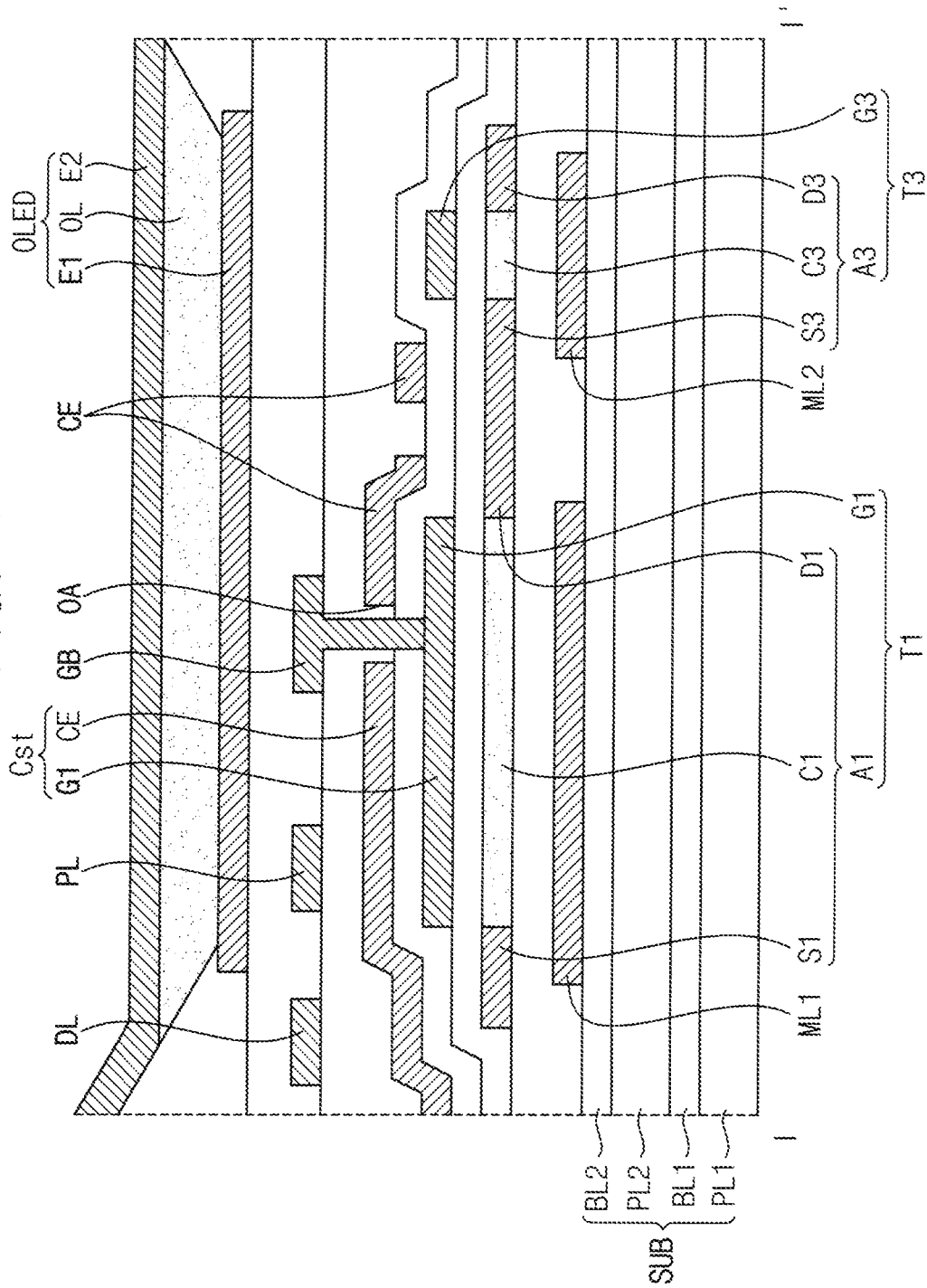
FIG. 4 is a sectional view taken along line I-I' of the display device of FIG. 3.

Referring to FIGS. 3 and 4, one pixel of the display device according to one embodiment of the present invention may include a pixel circuit including a first thin film transistor T1, a second thin film transistor T2, a third thin film transistor T3, a fourth thin film transistor T4, a fifth thin film transistor T5, a sixth thin film transistor T6, a seventh thin film transistor T7, a capacitor Cst, and a gate bridge GB selectively connected to a first scan line Sn, a second scan line Sn-1, a third scan line Sn-2, a light emitting control line EML, a data line DL, a driving voltage line PL, and an initialization voltage line Vint, and an organic light emitting element OLED connected to the pixel circuit.

The first metal line ML1 and the second metal line ML2 may traverse the pixel circuit, and extend, for example, in the second direction DR2. The first metal line ML1 may overlap a first active pattern A1 of the first thin film transistor T1, and the second metal line ML2 may overlap a third active pattern A3 of the third thin film transistor T3.

The substrate SUB may be an insulating substrate including glass, polymer, stainless steel, or the like. In one embodiment, the substrate SUB may include a first plastic layer PL1, a first barrier layer BL1, a second plastic layer PL2, and a second barrier layer BL2 that are sequentially laminated. For example, the first and second plastic layers PL1 and PL2 may include plastic such as polyimide (PI), polyethylene naphthalate (PEN), polyethylene terephthalate (PET), polyarylate (PAR), polycarbonate (PC), polyetherimide (PEI), or polyethersulfone (PS), and the first and second barrier layers BL1 and BL2 may include a silicon compound such as amorphous silicon (a-Si), silicon oxide (SiOx), or silicon nitride (SiNx).

The first thin film transistor T1 may be located on the substrate SUB, and may include a first active pattern A1 and a first gate electrode G1. The first active pattern A1 may include a first source electrode S1, a first channel C1, and a first drain electrode D1. The first source electrode S1 may be connected to the second drain electrode D2 of the second thin film transistor T2 and the fifth drain electrode D5 of the fifth thin film transistor T5, and the first drain electrode D1 may be connected to the third source electrode S3 of the third thin film transistor T3 and the sixth source electrode S6 of the sixth thin film transistor T6.

The first active pattern A1 may be formed of polysilicon or an oxide semiconductor. The oxide semiconductor may include any one of zinc oxide (ZnO), indium-gallium-zinc oxide (In—Ga—Zn—O), indium-zinc oxide (Zn—In—O), zinc-tin oxide (Zn—Sn—O) indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), and hafnium-indium-zinc oxide (Hf—In—Zn—O), which are oxide based on titanium (Ti), hafnium (Hf), zirconium (Zr), aluminum (Al), tantalum (Ta), germanium (Ge), zinc (Zn), gallium (Ga), tin (Sn) or indium (In), and/or complex oxide thereof. The first channel C1 of the first active pattern A1 may be channel-doped with an N-type impurity or a P-type impurity, and the first source electrode S1 and the first drain electrode D1 may be spaced apart from each other with the first channel C1 interposed therebetween, and may be doped with a doping impurity of a type opposite to that of the doping impurity doped in the first channel C1.

The first gate electrode G1 may be positioned on the first channel C1 of the first active pattern A1, and may have an island shape. The first gate electrode G1 may be connected to the fourth drain electrode D4 of the fourth thin film transistor T4 and the third drain electrode D3 of the third thin film transistor T3 by the gate bridge GB passing through a contact hole. The first gate electrode G1 may overlap a capacitor electrode CE, and may function as a gate electrode of the first thin film transistor T1 and also function as one electrode of the capacitor Cst. In other words, the first gate electrode G1 may form the capacitor Cst together with the capacitor electrode CE.

The first metal line (the first metal layer) ML1 may be positioned between the first active pattern A1 and the substrate SUB. Hereinafter, the first metal line ML1 and the first metal layer ML1 will be used interchangeably. The first channel C1 of the first active pattern A1 may overlap the first metal layer ML1, and a first voltage may be supplied to the first metal layer ML1, so that charges such as electrons or holes are accumulated in the first channel C1 of the first active pattern A1 according to the polarity of the first voltage supplied to the first metal layer ML1. Accordingly, a threshold voltage of the first thin film transistor T1 may be adjusted. In other words, the threshold voltage of the first thin film transistor T1 may be decreased or increased by using the first metal layer ML1, and the driving range of the first thin film transistor T1 may be changed by adjusting the threshold voltage of the first thin film transistor T1.

The second thin film transistor T2 may be located on the substrate SUB, and may include a second active pattern A2 and a second gate electrode G2. The second active pattern A2 may include a second source electrode S2, a second channel C2, and a second drain electrode D2. The second source electrode S2 may be connected to the data line DL through a contact hole, and the second drain electrode D2 may be connected to the first source electrode S1 of the first thin film transistor T1. The second channel C2, which is a channel area of the second active pattern A2 overlapping the second gate electrode G2, may be positioned between the second source electrode S2 and the second drain electrode D2. The second active pattern A2 may be connected to the first active pattern A1.

The second channel C2 of the second active pattern A2 may be channel-doped with an N-type impurity or a P-type impurity, and the second source electrode S2 and the second drain electrode D2 may be spaced apart from each other with the second channel C2 interposed therebetween, and may be doped with a doping impurity of a type opposite to the doping impurity doped in the second channel C2. The second active pattern A2 may be positioned on the same layer as the first active pattern A1, formed of the same material as the first active pattern A1, and integrally formed with the first active pattern A1.

The second gate electrode G2 may be positioned on the second channel C2 of the second active pattern A2, and integrally formed with the first scan line Sn. In one embodiment, the second metal line ML2 may not be positioned between the second active pattern A2 and the substrate SUB, and the second channel C2 of the second active pattern A2 may non-overlap the second metal line ML2. In another embodiment, as shown in FIG. 3, the second metal line ML2 may be positioned between the second active pattern A2 and the substrate SUB, and the second channel C2 of the second active pattern A2 may overlap the second metal line ML2.

The third thin film transistor T3 may be located on the substrate SUB, and include a third active pattern A3 and a third gate electrode G3. The third active pattern A3 may include a third source electrode S3, a third channel C3, and a third drain electrode D3. The third source electrode S3 may be connected to the first drain electrode D1, and the third drain electrode D3 may be connected to the first gate electrode G1 of the first thin film transistor T1 by the gate bridge GB passing through the contact hole. The third channel C3, which is a channel area of the third active pattern A3 overlapping the third gate electrode G3, may be positioned between the third source electrode S3 and the third drain electrode D3. The third active pattern A3 may be connected between the first active pattern A1 and the first gate electrode G1.

The third channel C3 of the third active pattern A3 may be channel-doped with an N-type impurity or a P-type impurity, and the third source electrode S3 and the third drain electrode D3 may be spaced apart from each other with the third channel C3 interposed therebetween, and may be doped with a doping impurity of a type opposite to the doping impurity doped in the third channel C3. The third active pattern A3 may be positioned on the same layer as the first active pattern A1 and the second active pattern A2, formed of the same material as the first active pattern A1 and the second active pattern A2, and integrally formed with the first active pattern A1 and the second active pattern A2.

The third gate electrode G3 may be positioned on the third channel C3 of the third active pattern A3, and integrally formed with the first scan line Sn. The third gate electrode G3 may be formed as a dual gate electrode.

The second metal line (the second metal layer) ML2 may be positioned between the third active pattern A3 and the substrate SUB. Hereinafter, the second metal line ML2 and the second metal layer ML2 will be used interchangeably. The third channel C3 of the third active pattern A3 may overlap the second metal layer ML2, and a second voltage may be supplied to the second metal layer ML2, so that charges such as electrons or holes are accumulated in the third channel C3 of the third active pattern A3 according to the polarity of the second voltage supplied to the second metal layer ML2. Accordingly a threshold voltage of the third thin film transistor T3 may be adjusted. In other words, the threshold voltage of the third thin film transistor T3 may be decreased or increased by using the second metal layer ML2, and the driving range of the third thin film transistor T3 may be changed by adjusting the threshold voltage of the third thin film transistor T3. The second voltage may be different from the first voltage.

The fourth thin film transistor T4 may be positioned on the substrate SUB, and include a fourth active pattern A4 and a fourth gate electrode G4. The fourth active pattern A4 may include a fourth source electrode S4, a fourth channel C4, and a fourth drain electrode D4. The fourth source electrode S4 may be connected to the initialization voltage line Vint through the contact hole, and the fourth drain electrode D4 may be connected to the first gate electrode G1 of the first thin film transistor T1 by the gate bridge GB passing through the contact hole. The fourth channel C4, which is a channel area of the fourth active pattern A4 overlapping the fourth gate electrode G4, may be positioned between the fourth source electrode S4 and the fourth drain electrode D4. The fourth active pattern A4 may be connected between the initialization voltage line Vint and the first gate electrode G1, and connected to the third active pattern A3 and the first gate electrode G1.

The fourth channel C4 of the fourth active pattern A4 may be channel-doped with an N-type impurity or a P-type impurity, and the fourth source electrode S4 and the fourth drain electrode D4 may be spaced apart from each other with a fourth channel C4 interposed therebetween, and may be doped with a doping impurity of a type opposite to the doping impurity doped in the fourth channel C4. The fourth active pattern A4 may be positioned on the same layer as the first active pattern A1, the second active pattern A2, and the third active pattern A3, formed of the same material as the first active pattern A1, the second active pattern A2, and the third active pattern A3, and integrally formed with the first active pattern A1, the second active pattern A2, and the third active pattern A3.

The fourth gate electrode G4 may be positioned on the fourth channel C4 of the fourth active pattern A4, and integrally formed with the second scan line Sn-1. The fourth gate electrode G4 may be formed as a dual gate electrode.

The fifth thin film transistor T5 may be located on the substrate SUB, and include a fifth active pattern A5 and a fifth gate electrode G5 The fifth active pattern A5 may include a fifth source electrode S5, a fifth channel C5, and a fifth drain electrode D5. The fifth source electrode S5 may be connected to the driving voltage line PL through the contact hole, and the fifth drain electrode D5 may be connected to the first source electrode S1 of the first thin film transistor T1. The fifth channel C5, which is a channel area of the fifth active pattern A5 overlapping the fifth gate electrode G5, may be positioned between the fifth source electrode S5 and the fifth drain electrode D5. The fifth active pattern A5 may be connected between the driving voltage line PL and the first active pattern A1.

The fifth channel C5 of the fifth active pattern A5 may be channel-doped with an N-type impurity or a P-type impurity, and the fifth source electrode S5 and the fifth drain electrode D5 may be spaced apart from each other with a fifth channel C5 interposed therebetween, and may be doped with a doping impurity of a type opposite to the doping impurity doped in the fifth channel C5. The fifth active pattern A5 may be positioned on the same layer as the first active pattern A1, the second active pattern A2, the third active pattern A3, and the fourth active pattern A4, formed of the same material as the first active pattern A1, the second active pattern A2, the third active pattern A3, and the fourth active pattern A4, and integrally formed with the first active pattern A1, the second active pattern A2, the third active pattern A3, and the fourth active pattern A4.

The fifth gate electrode G5 may be positioned on the fifth channel C5 of the fifth active pattern A5, and integrally formed with the light emitting control line EML.

The sixth thin film transistor T6 may be located on the substrate SUB, and include a sixth active pattern A6 and a sixth gate electrode G6. The sixth active pattern A6 may include a sixth source electrode S6, a sixth channel C6, and a sixth drain electrode D6. The sixth source electrode S6 may be connected to the first drain electrode D1 of the first thin film transistor T1, and the sixth drain electrode D6 may be connected to a first electrode E1 of the organic light emitting element OLED through the contact hole. The sixth channel C6, which is a channel area of the sixth active pattern A6 overlapping the sixth gate electrode G6, may be positioned between the sixth source electrode S6 and the sixth drain electrode D6. The sixth active pattern A6 may be connected between the first active pattern A1 and the first electrode E1 of the organic light emitting element OLED.

The sixth channel C6 of the sixth active pattern A6 may be channel-doped with an N-type impurity or a P-type impurity, and the sixth source electrode S6 and the sixth drain electrode D6 may be spaced apart from each other with the sixth channel C6 interposed therebetween, and may be doped with a doping impurity of a type opposite to that of the doping impurity doped in the sixth channel C6. The sixth active pattern A6 may be positioned on the same layer as the first active pattern A1, the second active pattern A2, the third active pattern A3, the fourth active pattern A4, and the fifth active pattern A5 formed of the same material as the first active pattern A1, the second active pattern A2, the third active pattern A3, the fourth active pattern A4, and the fifth active pattern A5, and integrally formed with the first active pattern A1, the second active pattern A2, the third active pattern A3, the fourth active pattern A4, and the fifth active pattern A5.

The sixth gate electrode G6 may be positioned on the sixth channel C6 of the sixth active pattern A6, and integrally formed with the light emitting control line EML.

The seventh thin film transistor T7 may be located on the substrate SUB, and include a seventh active pattern A7 and a seventh gate electrode G7. The seventh active pattern A7 may include a seventh source electrode S7, a seventh channel C7, and a seventh drain electrode D7. The seventh source electrode S7 may be connected to the first electrode of the organic light emitting element of another pixel not shown in FIG. 3 (for example, another pixel positioned under the one pixel shown in FIG. 3), and the seventh drain electrode D7 may be connected to the fourth source electrode S4 of the fourth thin film transistor T4. The seventh channel C7, which is a channel area of the seventh active pattern A7 overlapping the seventh gate electrode G7, may be positioned between the seventh source electrode S7 and the seventh drain electrode D7. The seventh active pattern A7 may be connected between the first electrode of the organic light emitting element and the fourth active pattern A4.

The seventh channel C7 of the seventh active pattern A7 may be channel-doped with an N-type impurity or a P-type impurity, and the seventh source electrode S7 and the seventh drain electrode D7 may be spaced apart from each other with the seventh channel C7 interposed therebetween, and may be doped with a doping impurity of a type opposite to that of the doping impurity doped in the seventh channel C7. The seventh active pattern A7 may be positioned on the same layer as the first active pattern A1, the second active pattern A2, the third active pattern A3, the fourth active pattern A4, the fifth active pattern A5, and the sixth active pattern A6, formed of the same material as the first active pattern A1, the second active pattern A2, the third active pattern A3, the fourth active pattern A4, the fifth active pattern A5, and the sixth active pattern A6, and integrally formed with the first active pattern A1, the second active pattern A2, the third active pattern A3, the fourth active pattern A4, the fifth active pattern A5, and the sixth active pattern A6.

The seventh gate electrode G7 may be positioned on the seventh channel C7 of the seventh active pattern A7, and integrally formed with the third scan line Sn-2.

The first scan line Sn may be positioned on the second active pattern A2 and the third active pattern A3 so as to extend in a direction crossing the second active pattern A2 and the third active pattern A3 (e.g., the second direction DR2). The first scan line Sn may be integrally formed with the second gate electrode G2 and the third gate electrode G3 so as to be connected to the second gate electrode G2 and the third gate electrode G3.

The second scan line Sn-1 may be spaced apart from the first scan line Sn and positioned on the fourth active pattern A4, and extend in a direction crossing the fourth active pattern A4 (e.g., the second direction DR2). The second scan line Sn-1 may be integrally formed with the fourth gate electrode G4 so as to be connected to the fourth gate electrode G4.

The third scan line Sn-2 may be spaced apart from the second scan line Sn-1 and positioned on the seventh active pattern A7, and extend in a direction crossing the seventh active pattern A7 (e.g., the second direction DR2). The third scan line Sn-2 may be integrally formed with the seventh gate electrode G7 so as to be connected to the seventh gate electrode G7.

The light emitting control line EML may be spaced apart from the first scan line Sn and positioned on the fifth active pattern A5 and the sixth active pattern A6, and extend in a direction crossing the fifth active pattern A5 and the sixth active pattern A6 (e.g., the second direction DR2). The light emitting control line EML may be integrally formed with the fifth gate electrode G5 and the sixth gate electrode G6 so as to be connected to the fifth gate electrode G5 and the sixth gate electrode G6.

The first scan line Sn, the second scan line Sn-1, the third scan line Sn-2, the light emitting control line EML, the first gate electrode G1, the second gate electrode G2, the third gate electrode G3, the fourth gate electrode G4, the fifth gate electrode G5, the sixth gate electrode G6, and the seventh gate electrode G7 may be positioned on the same layer, and formed of the same material. Meanwhile, in another embodiment of the present invention, the first scan line Sn, the second scan line Sn-1, the third scan line Sn-2, the light emitting control line EML, the first gate electrode G1, the second gate electrode G2, the third gate electrode G3, the fourth gate electrode G4, the fifth gate electrode G5, the sixth gate electrode G6, and the seventh gate electrode G7 may be selectively positioned in different layers and formed of different materials, respectively.

The capacitor Cst may include one electrode and the other electrode facing each other with an insulating layer therebetween. The one electrode may be a capacitor electrode CE, and the other electrode may be a first gate electrode G1. The capacitor electrode CE may be positioned on the first gate electrode G1, and connected to the driving voltage line PL through the contact hole. The capacitor electrode CE may form the capacitor Cst together with the first gate electrode G1, and the first gate electrode G1 and the capacitor electrode CE may be formed of different or identical metals on different layers.

The capacitor electrode CE may include an opening OA overlapping a part of the first gate electrode G1, and the gate bridge GB may be connected to the first gate electrode G1 through the opening OA. The capacitor electrode CE may overlap the first metal layer ML.

The data line DL may be positioned on the first scan line Sn and extend in a direction crossing the first scan line Sn (e.g., the first direction DR1). The data line DL may be connected to the second source electrode S2 of the second active pattern A2 through the contact hole. The data line DL may extend while crossing the first scan line Sn, the second scan line Sn-1, the third scan line Sn-2, and the light emitting control line EML.

The driving voltage line PL may be spaced apart from the data line DL and positioned on the first scan line Sn so as to extend in a direction crossing the first scan line Sn (e.g., the first direction DR1). The driving voltage line PL may be connected to the capacitor electrode CE and the fifth source electrode S5 of the fifth active pattern A5 connected to the first active pattern A1 through the contact hole. The driving voltage line PL may extend while crossing the first scan line Sn, the second scan line Sn-1, the third scan line Sn-2, and the light emitting control line EML.

The gate bridge GB may be positioned on the first scan line Sn and spaced apart from the driving voltage line PL. The gate bridge GB may be connected to each of the third drain electrode D3 of the third active pattern A3 and the fourth drain electrode D4 of the fourth active pattern A4 through one contact hole, and connected to the first gate electrode G1 exposed by the opening OA of the capacitor electrode CE through another contact hole.

The above-described data line DL, driving voltage line PL, and gate bridge GB may be positioned on the same layer, and formed of the same material. Meanwhile, in another embodiment of the present invention, the data line DL, the driving voltage line PL, and the gate bridge GB may be selectively positioned on different layers and formed of different materials, respectively.

The initialization voltage line Vint may be positioned on the second scan line Sn-1, and connected to the fourth source electrode S4 of the fourth active pattern A4 through the contact hole. The initialization voltage line Vint may be positioned on the same layer as the first electrode E1 of the organic light emitting element OLED, and formed of the same material. Meanwhile, in another embodiment of the present invention, the initialization voltage line Vint may be positioned on a layer different from the first electrode E1, and formed of another material.

The organic light emitting element OLED may include a first electrode E1, an organic light emitting layer OL, and a second electrode E2. The first electrode E1 may be connected to the sixth drain electrode D6 of the sixth thin film transistor T6 through the contact hole. The organic light emitting layer OL may be positioned between the first electrode E1 and the second electrode E2. The second electrode E2 may be positioned on the organic light emitting layer OL. At least one of the first electrode E1 and the second electrode E2 may be any one of a light transmissive electrode, a light reflective electrode, and a light semi-transmissive electrode, and light emitted from the organic light emitting layer OL may be emitted in a direction of at least one of the first electrode E1 and the second electrode E2.

A capping layer covering the organic light emitting element OLED may be positioned on the organic light emitting element OLED, and a thin film encapsulation layer or an encapsulation substrate may be positioned on the organic light emitting element OLED with the capping layer interposed therebetween.

The first metal layer ML1 may be positioned between the first active pattern A1 of the first thin film transistor T1 and the substrate SUB, and the second metal layer ML2 may be positioned between the third active pattern A3 of the third thin film transistor T3 and the substrate SUB. The first metal layer ML1 may overlap the first channel C1 of the first active pattern A1, and the second metal layer ML2 may overlap the third channel C3 of the third active pattern A3. The first voltage may be supplied to the first metal layer ML1, and the second voltage different from the first voltage may be supplied to the second metal layer ML2.

The polarity of the first voltage and the polarity of the second voltage may be different from each other. In one embodiment, the first voltage applied to the first metal layer ML1 may have a negative polarity, and the second voltage applied to the second metal layer ML2 may have a positive polarity. For example, the first voltage may be about −5 V to about −3 V, and the second voltage may be about +4 V to about +6 V.

When the first voltage applied to the first metal layer ML1 overlapping the first channel C1 of the first thin film transistor T1 is different from the second voltage applied to the second metal layer ML2 overlapping the third channel C3 of the third thin film transistor T3, the driving range of the first thin film transistor T1 may be different from the driving range of the third thin film transistor T3. In one embodiment, the driving range of the first thin film transistor T1 may be wider than the driving range of the third thin film transistor T3.

Figure 5:
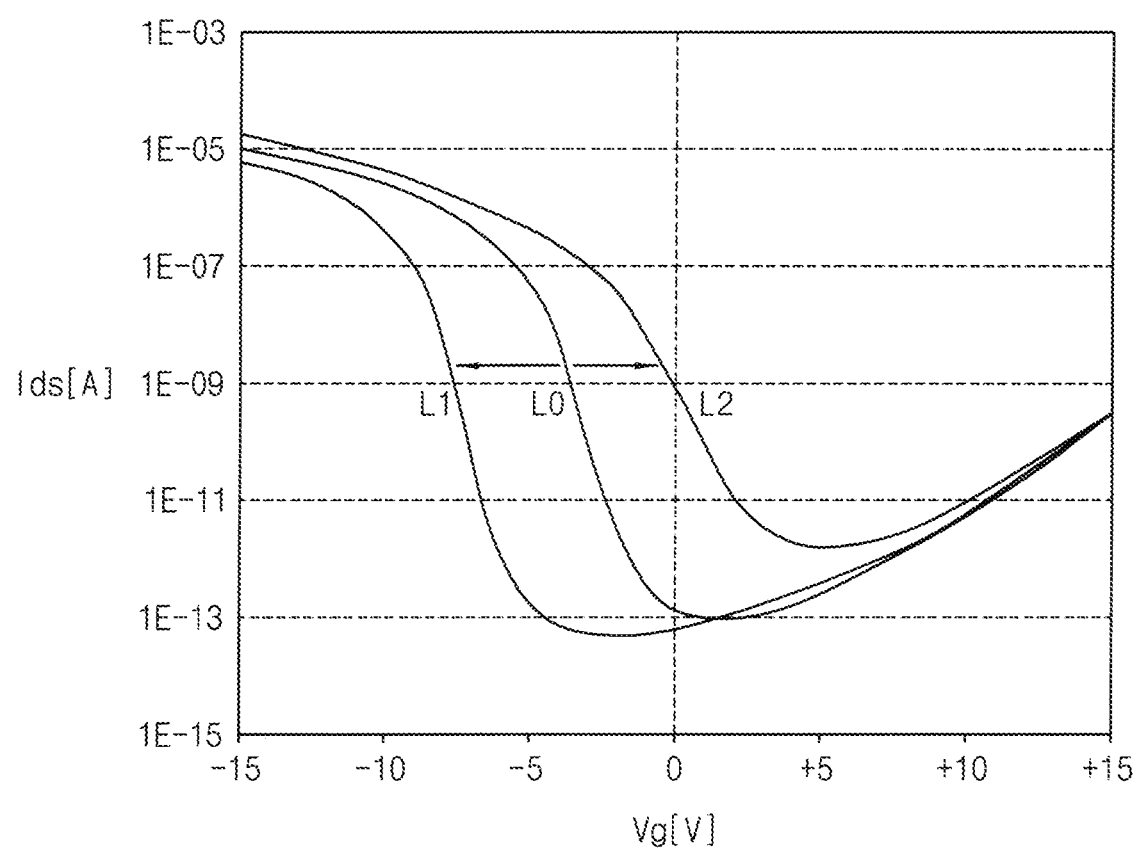
FIG. 5 is a graph showing changes in s-factor of a thin film transistor according to a voltage applied to a metal line.

FIG. 5 is a graph showing changes in s-factor of the thin film transistor according to the voltage applied to the metal line.

Referring to FIG. 5, in the thin film transistor overlapping the metal line located thereunder, the s-factor of the thin film transistor may vary according to changes in voltage applied to the metal line. In FIG. 5, a first curve L0 shows that no voltage is applied to the metal line, a second curve L1 shows that a voltage having a negative polarity is applied to the metal line, and a third curve L2 shows that a voltage having a positive polarity is applied to the metal line. The "s-factor" refers to a current-voltage characteristic of a thin film transistor, and denotes a gate voltage required to increase a drain current by 10 times when the gate voltage equal to or less than the threshold voltage is applied. The "s-factor" is generally referred to as the "sub-threshold slope". The s-factor may be proportional to a slope of a curve (hereinafter, referred to as an 'I-V curve') representing the relationship between the source-drain current Ids and the gate voltage Vg of the thin film transistor.

As shown in FIG. 5, when the voltage having a negative polarity is applied to the metal line, the I-V curve of the thin film transistor may move from the first curve L0 to the second curve L1 to increase the slope of the I-V curve, and the s-factor of the thin film transistor may be increased. In addition, when the voltage having a positive polarity is applied to the metal line, the I-V curve of the thin film transistor may move from the first curve L0 to the third curve L2 to decrease the slope of the I-V curve, and the s-factor of the thin film transistor may be decreased. In general, it is advantageous when a switching thin film transistor or compensation thin film transistor has a relatively small s-factor for fast driving speed. However, it may be advantageous when the driving thin film transistor has a relatively large s-factor so as to reduce a luminance deviation due to gate voltage dispersion.

Figure 6:
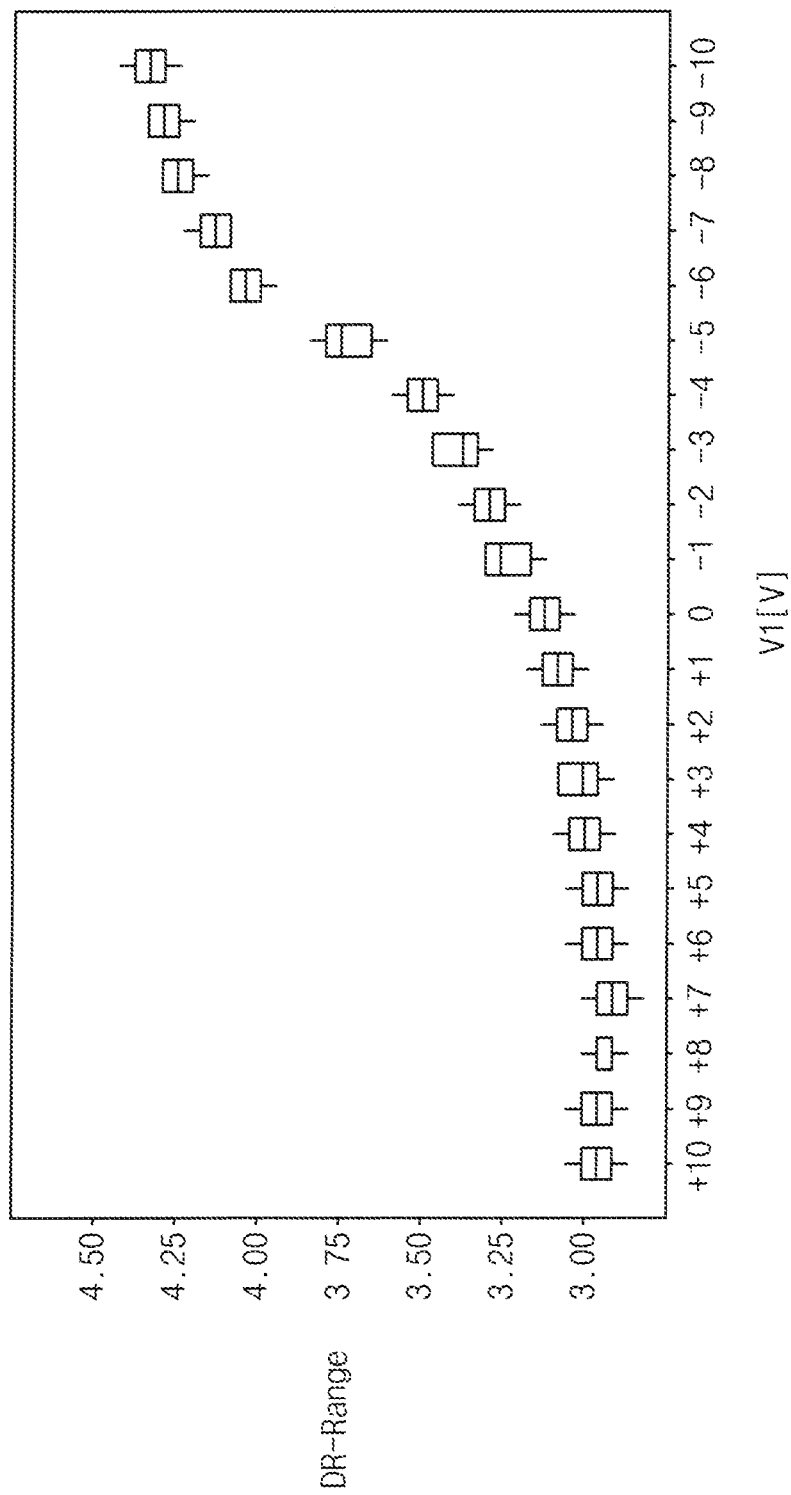
FIG. 6 is a graph showing changes in driving range of a first thin film transistor according to a voltage applied to a first metal line.
Figure 7:
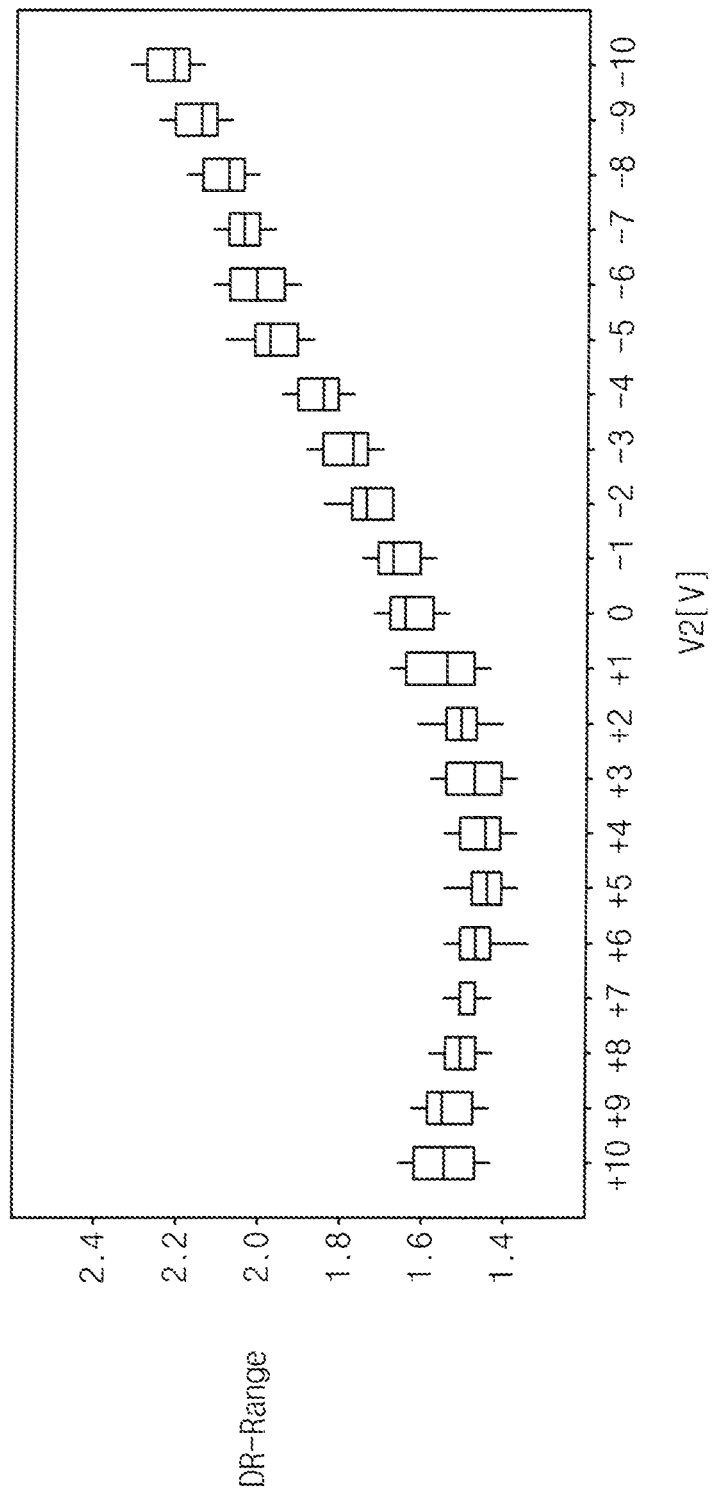
FIG. 7 is a graph showing changes in driving range DR-range of a third thin film transistor according to a voltage applied to a second metal line.

FIG. 6 is a graph showing changes in driving range DR-range of the first thin film transistor T1 according to a voltage V1 applied to the first metal line ML1. FIG. 7 is a graph showing changes in driving range DR-range of the third thin film transistor T3 according to a voltage V2 applied to the second metal line ML2.

Referring to FIG. 6, the driving range DR-range of the first thin film transistor T1 may be increased as the magnitude of the voltage V1 applied to the first metal line ML1 is decreased. The driving range DR-range of the first thin film transistor T1 as a driving thin film transistor denotes a difference between the maximum gate-source voltage of the driving thin film transistor corresponding to the maximum gray level and the minimum gate-source voltage of the driving thin film transistor corresponding to the minimum gray level, or a difference between the gate-source voltages of the driving thin film transistor according to each step for gray level expression. When the driving range of the gate-source voltage of the driving thin film transistor is wide, the gray level of light emitted from the organic light emitting element OLED may be controlled more precisely by changing the magnitude of the gate-source voltage, so that the resolution of the display device can be increased and the display quality can be improved.

As described above, when the first voltage applied to the first metal line ML1 has the negative polarity (e.g., about −5 V to about −3 V), the first thin film transistor T1 may have a relatively wide driving range. When the first voltage is less than about −5 V, the driving range of the first thin film transistor T1 may be widened, but other characteristics of the first thin film transistor T1 may deteriorate. When the first voltage is greater than about −3 V, the driving range of the first thin film transistor T1 may be narrowed.

Referring to FIG. 7, the driving range DR-range of the third thin film transistor T3 may vary according to the magnitude of the voltage V2 applied to the second metal line ML2. When the driving range DR-range of the third thin film transistor T3 as a compensation thin film transistor is narrow, a switching function of the third thin film transistor T3 operated according to a scan signal applied from the first scan line may be improved.

As described above, when the second voltage applied to the second metal line ML2 has the positive polarity (e.g., about +4 V to about +6 V), the third thin film transistor T3 may have a relatively narrow driving range. When the second voltage is less than about +4 V or greater than about +6 V, the driving range of the third thin film transistor T3 may be widened.

Referring back to FIGS. 3 and 4, the first metal layer ML1 and the second metal layer ML2 may include metal such as molybdenum (Mo), but the present invention is not limited thereto. Another material, which is a conductive material such as a conductive polymer, may be included. The first metal layer ML1 and the second metal layer ML2 may include the same material or include different materials.

Accordingly, in the display device according to one embodiment of the present invention, because the first metal layer ML1, to which the first voltage is applied, may overlap at least one thin film transistor (e.g., the first thin film transistor T1), and the second metal layer ML2, to which the second voltage different from the first voltage is applied, may overlap at least one other thin film transistor (e.g., the third thin film transistor T3), thereby individually adjusting the driving range of each thin film transistor, so that the characteristics of thin film transistors having functions different from each other can be improved.

Specifically, the first voltage having a negative polarity may be applied to the first thin film transistor T1 serving as a driving thin film transistor, so that the driving range of the first thin film transistor T1 may be widened. In addition, the second voltage having a positive polarity may be applied to the third thin film transistor T3 serving as a compensation thin film transistor, so that the driving range of the third thin film transistor T3 may be narrowed. When the driving range of the first thin film transistor T1 is widened, the gray level of the light emitted from the organic light emitting element OLED may be controlled more precisely, and when the driving range of the third thin film transistor T3 is narrowed, the switching function of the third thin film transistor T3 may be improved.

Hereinafter, a display device according to another embodiment of the present invention will be described with reference to FIGS. 8 to 10.

Hereinafter, the features different from the display device according to the above-described one embodiment of the present invention will be described.

Figure 8:
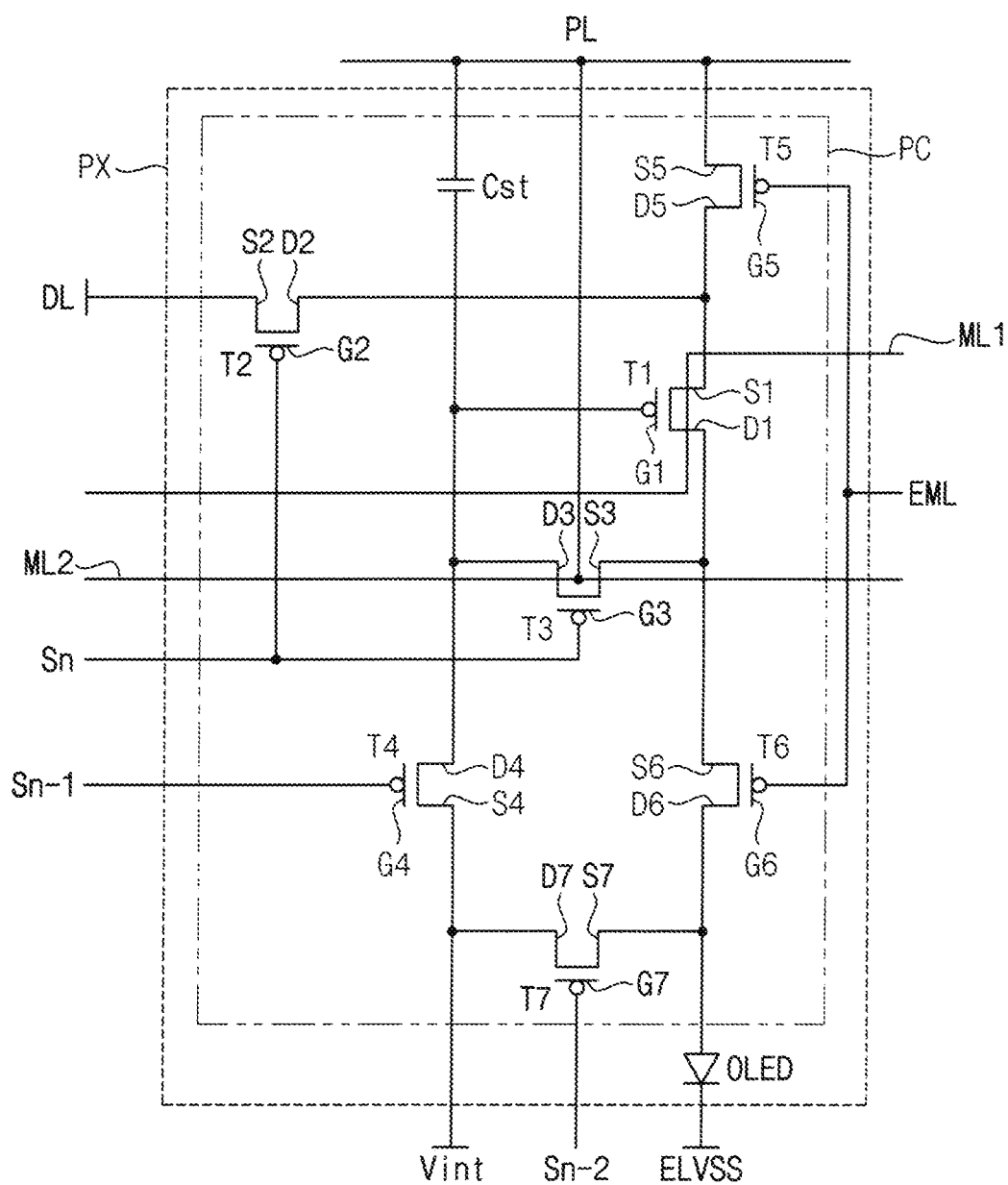
FIG. 8 is a circuit diagram showing one pixel of a display device according to another embodiment of the present invention.

FIG. 8 is a circuit diagram showing one pixel of the display device according to another embodiment of the present invention. For example, FIG. 8 may show another example of the one pixel of the display device of FIG. 1.

Referring to FIG. 8, one pixel PX of the display device according to another embodiment of the present invention may include a pixel circuit PC and an organic light emitting element OLED connected to the pixel circuit PC. The pixel circuit PC may include a plurality of thin film transistors T1, T2, T3, T4, T5, T6, and T7, and a capacitor Cst. The thin film transistors T1, T2, T3, T4, T5, T6, and T7 may be selectively connected to each of a first scan line Sn, a second scan line Sn-1, a third scan line Sn—2, a light emitting control line EML, an initialization voltage line Vint, a data line DL, and a driving voltage line PL.

The second metal line ML2 may pass through the third thin film transistor T3, and specifically, the second metal line ML2 may overlap the active pattern of the third thin film transistor T3 while crossing the pixel circuit PC. The second metal line ML2 may be connected to the driving voltage line PL.

Hereinafter, the arrangement of one pixel of the display device according to another embodiment of the present invention will be described with reference to FIGS. 9 and 10.

Figure 9:
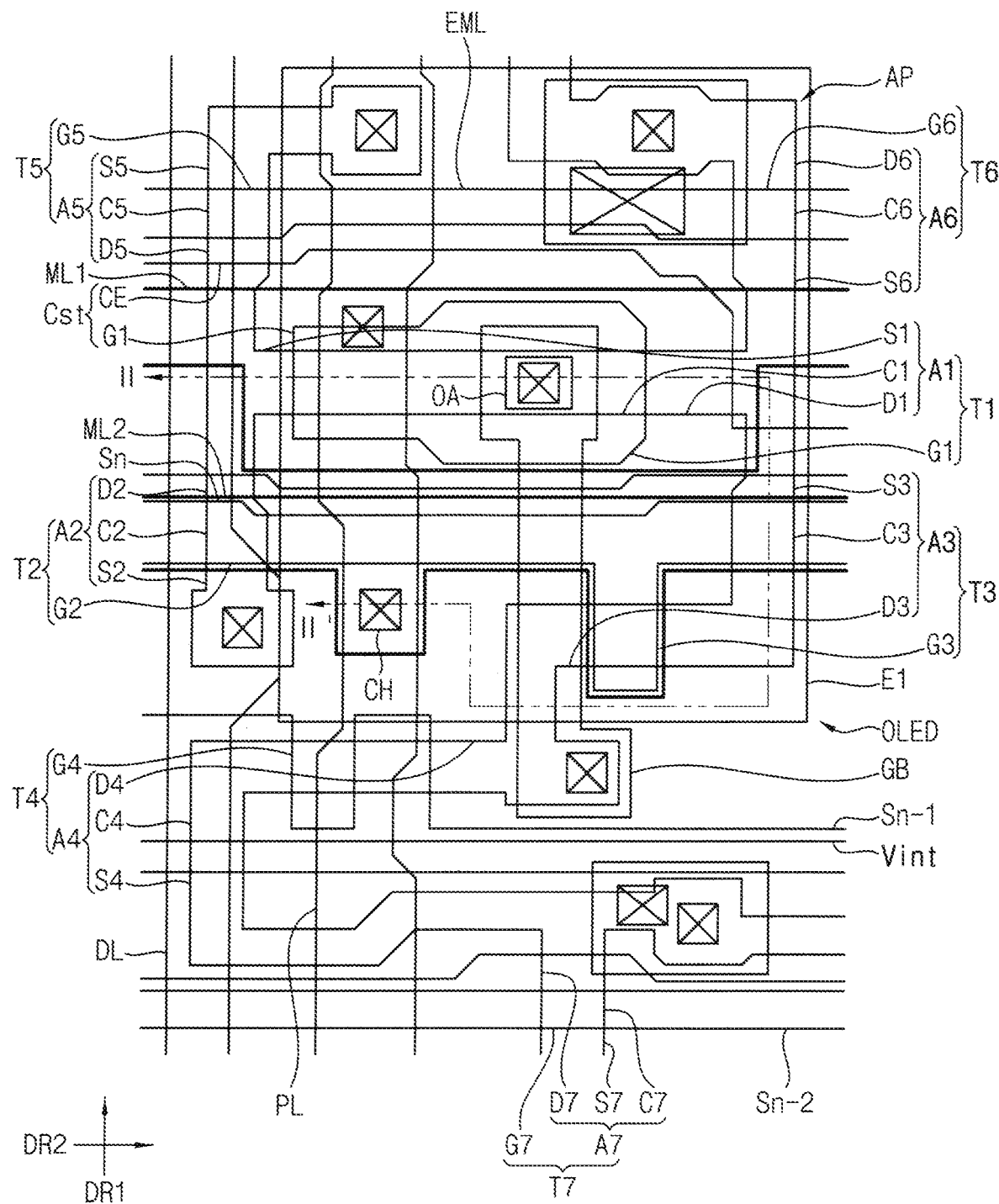
FIG. 9 is a layout diagram showing one pixel of FIG. 8.

FIG. 9 is a layout diagram showing one pixel of FIG. 8. FIG. 10 is a sectional view taken along line II-II' of FIG. 9.

Figure 10:
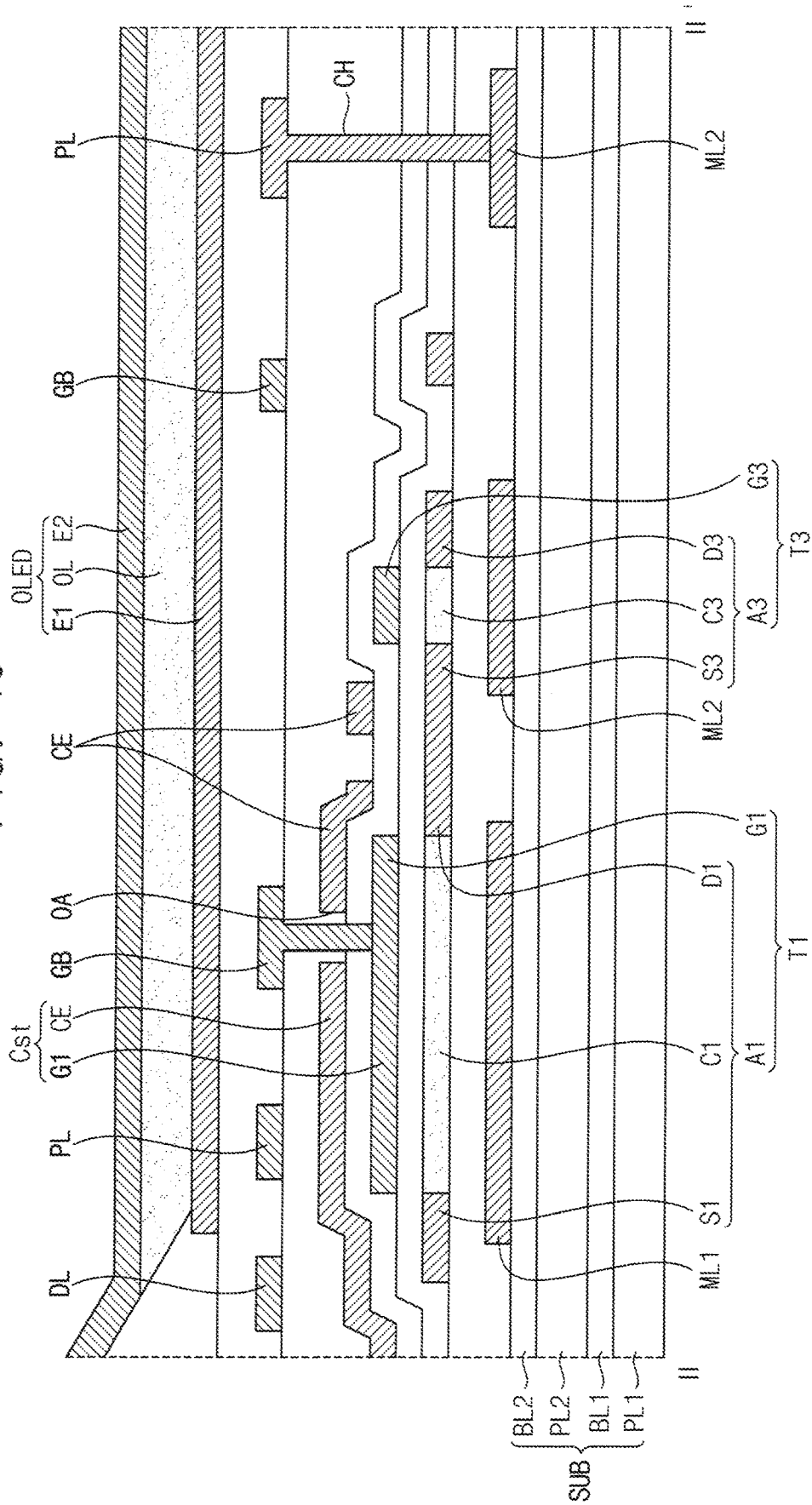
FIG. 10 is a sectional view taken along line II-II' of FIG. 9.

Referring to FIGS. 9 and 10, one pixel of the display device according to another embodiment of the present invention may include a pixel circuit including a first thin film transistor T1, a second thin film transistor T2, a third thin film transistor T3, a fourth thin film transistor T4, a fifth thin film transistor T5, a sixth thin film transistor T6, a seventh thin film transistor T7, a capacitor Cst, and a gate bridge GB selectively connected to a first scan line Sn, a second scan line Sn-1, a third scan line Sn-2, a light emitting control line EML, a data line DL, a driving voltage line PL, and an initialization voltage line Vint, and an organic light emitting element OLED connected to the pixel circuit.

The first metal line ML1 and the second metal line ML2 may transverse the pixel circuit and extend in, for example, the second direction DR2. The first metal line ML1 may overlap a first active pattern A1 of the first thin film transistor T1, and the second metal line ML2 may overlap a third active pattern A3 of the third thin film transistor T3.

In a display device according to another embodiment of the present invention unlike the display device according to the above-described one embodiment of the present invention, the second metal line ML2 may be electrically connected to the driving voltage line PL. In this case, the second voltage supplied to the second metal line ML2 may be substantially the same as the driving voltage ELVDD supplied to the driving voltage line PL. In one embodiment, the driving voltage ELVDD may have a positive polarity, and for example, the magnitude of the driving voltage ELVDD may be about 4.6 V.

In one embodiment, the second metal line ML2 and the driving voltage line PL may be electrically connected to each other in the pixel PX positioned in the display area DA. For example, as shown in FIGS. 9 and 10, a contact hole CH may be formed in a portion in which the driving voltage line PL extending in the first direction DR1 of the insulating layers positioned between the second metal line ML2 and the driving voltage line PL intersects the second metal line ML2 extending in the second direction DR2, and the second metal line ML2 may come into contact with the driving voltage line PL through the contact hole CH.

In another embodiment, the second metal line ML2 and the driving voltage line PL may be electrically connected to each other in the peripheral area PA outside the display area DA. For example, the second connection line CL2 connected to the second metal line ML2 may be positioned in the peripheral area PA, and connected to the driving voltage supply line PSL for supplying the driving voltage ELVDD, so that the second metal line ML2 may receive the driving voltage ELVDD.

INDUSTRIAL APPLICABILITY

The display device according to the embodiments of the present invention may be applied to a display device included in a computer, a notebook, a mobile phone, a smartphone, a smart pad, a PMP, a PDA, an MP3 player, or the like.

Although the display devices according to the embodiments of the present invention have been described with reference to the drawings, the illustrated embodiments are examples, and may be modified and changed by a person having ordinary knowledge in the relevant technical field without departing from the technical spirit of the present invention described in the following claims.

DESCRIPTION OF SOME OF THE REFERENCE SYMBOLS

SUB: substrate
DA: display area
PA: peripheral area
OLED: organic light emitting element
PC: pixel circuit T1-T7: transistors
ML1: first metal layer
ML2: second metal layer
CL1: first connection line
CL2: second connection line
PL: driving voltage line

The invention claimed is:

1. A display device comprising:
a substrate;
an organic light emitting element on the substrate;
a pixel circuit between the substrate and the organic light emitting element, electrically connected to the organic light emitting element, and including a first transistor and a second transistor;
a first metal layer between the substrate and the pixel circuit, overlapping the first transistor, and configured to receive a first voltage; and
a second metal layer between the substrate and the pixel circuit, overlapping the second transistor, and configured to receive a second voltage different from the first voltage,
wherein the first voltage and the second voltage have polarities different from each other.

2. The display device of claim 1, wherein the first transistor and the second transistor have driving ranges different from each other.

3. The display device of claim 1, wherein the first voltage has a negative polarity, and the second voltage has a positive polarity.

4. The display device of claim 3, wherein the first voltage is −3 V to −5 V.

5. The display device of claim 4, wherein the second voltage is +4 V to +6 V.

6. The display device of claim 3, wherein the first transistor includes a first active pattern on the substrate and including a first channel, and a first gate electrode on the first active pattern, and the first metal layer overlaps the first channel.

7. The display device of claim 6, wherein the second transistor includes a second active pattern connected between the first active pattern and the first gate electrode and including a second channel, and a second gate electrode on the second active pattern, and the second metal layer overlaps the second channel.

8. The display device of claim 7, wherein the pixel circuit further includes a third transistor including a third active pattern connected to the first active pattern, and a third gate electrode on the third active pattern, and the second metal layer overlaps a third channel of the third transistor.

9. The display device of claim 3, wherein the first transistor has a driving range wider than a driving range of the second transistor.

10. The display device of claim 3, wherein the first metal layer is connected to a connection line outside the pixel circuit.

11. The display device of claim 3, wherein the second metal layer is connected to a connection line outside the pixel circuit or connected to a driving voltage line crossing the pixel circuit.

12. The display device of claim 1, wherein each of the first transistor and the second transistor includes a PMOS transistor.

13. A display device comprising:
a substrate including a display area and a peripheral area;
a plurality of organic light emitting elements on the display area of the substrate;
a plurality of pixel circuits between the substrate and the organic light emitting elements, electrically connected to the organic light emitting elements, respectively, and each including a first transistor and a second transistor;
a plurality of first metal lines between the substrate and the pixel circuits, overlapping the first transistor of each of the pixel circuits, and configured to receive a first voltage; and
a plurality of second metal lines between the substrate and the pixel circuits, overlapping the second transistor of each of the pixel circuits, and configured to receive a second voltage different from the first voltage,
wherein the first voltage and the second voltage have polarities different from each other.

14. The display device of claim 13, further comprising:
a plurality of driving voltage lines extending in a first direction and configured to supply driving voltages to the organic light emitting elements, wherein
the first metal lines and the second metal lines extend in a second direction intersecting the first direction.

15. The display device of claim 14, further comprising:
a first connection line extending in the first direction and connected to the first metal lines, wherein
the first connection line is configured to receive the first voltage through a first pad on the peripheral area of the substrate.

16. The display device of claim 15, wherein the second metal lines are connected to the driving voltage lines, respectively, and the second metal lines are configured to receive the second voltage through the driving voltage lines, respectively.

17. The display device of claim 15, further comprising:
a second connection line extending in the first direction and connected to the second metal lines, wherein
the second connection line is configured to receive the second voltage through a second pad on the peripheral area of the substrate.

18. The display device of claim 13, wherein the first transistor and the second transistor have driving ranges different from each other.

* * * * *